(12) United States Patent
Auyeung et al.

(10) Patent No.: US 8,728,589 B2
(45) Date of Patent: May 20, 2014

(54) LASER DECAL TRANSFER OF ELECTRONIC MATERIALS

(75) Inventors: Raymond Auyeung, Alexandria, VA (US); Alberto Pique, Crofton, MD (US); Thomas H. Bailey, San Jose, CA (US); Lydia J. Young, Palo Alto, CA (US)

(73) Assignee: Photon Dynamics, Inc., San Jose, CA (US)

( * ) Notice: Subject to any disclaimer, the term of this patent is extended or adjusted under 35 U.S.C. 154(b) by 943 days.

(21) Appl. No.: 11/970,495

(22) Filed: Jan. 7, 2008

(65) Prior Publication Data
US 2009/0074987 A1    Mar. 19, 2009

Related U.S. Application Data

(60) Provisional application No. 60/972,704, filed on Sep. 14, 2007.

(51) Int. Cl.
C23C 14/28 (2006.01)
H05B 6/00 (2006.01)
C23C 14/30 (2006.01)
C23C 14/14 (2006.01)

(52) U.S. Cl.
USPC .......................... 427/596; 427/595; 427/597

(58) Field of Classification Search
USPC ........................... 427/595, 596, 597
See application file for complete search history.

(56) References Cited

U.S. PATENT DOCUMENTS

| 4,588,674 A | 5/1986 | Stewart et al. |
| 4,752,455 A | 6/1988 | Mayer |
| 4,801,352 A | 1/1989 | Piwczyk |
| 4,880,959 A | 11/1989 | Baum et al. |
| 4,970,196 A | 11/1990 | Kim et al. |
| 4,987,006 A | 1/1991 | Williams et al. |
| 5,164,565 A | 11/1992 | Addiego |

(Continued)

FOREIGN PATENT DOCUMENTS

| TW | 200804942 A | 1/2008 |
| TW | 200918182 A | 5/2009 |
| WO | WO 2007/134300 A3 | 11/2007 |
| WO | WO 2009/035854 A1 | 3/2009 |

OTHER PUBLICATIONS

International Search Report of The International Searching Authority for Application No. PCT/US2008/74508, Nov. 28, 2008.

(Continued)

*Primary Examiner* — Michael Wieczorek
(74) *Attorney, Agent, or Firm* — Kilpatrick Townsend and Stockton LLP

(57) ABSTRACT

A laser decal transfer is used to generate thin film features by directing laser pulses of very low energy at the back of a target substrate illuminating an area of a thin layer of a high viscosity rheological fluid coating the front surface of the target. The illuminated area is shaped and defined by an aperture centered about the laser beam. The decal transfer process allows for the release and transfer from the target substrate to the receiving substrate a uniform and continuous layer identical in shape and size of the laser irradiated area. The released layer is transferred across the gap with almost no changes to its initial size and shape. The resulting patterns transferred onto the receiving substrate are highly uniform in thickness and morphology, have sharp edge features and exhibit high adhesion, independent of the surface energy, wetting or phobicity of the receiving substrate.

28 Claims, 3 Drawing Sheets

(56) References Cited

U.S. PATENT DOCUMENTS

| | | | |
|---|---|---|---|
| 5,246,885 A | | 9/1993 | Baren et al. |
| 6,060,127 A | * | 5/2000 | Tatah et al. ............... 427/458 |
| 6,159,832 A | | 12/2000 | Mayer |
| 6,177,151 B1 | | 1/2001 | Chrissey et al. |
| 6,441,943 B1 | | 8/2002 | Roberts et al. |
| 6,583,318 B2 | | 6/2003 | Campian et al. |
| 6,649,861 B2 | * | 11/2003 | Duignan ............... 219/121.6 |
| 6,660,343 B2 | | 12/2003 | McGill et al. |
| 6,766,764 B1 | | 7/2004 | Chrisey et al. |
| 6,792,326 B1 | | 9/2004 | Duignan |
| 6,805,918 B2 | | 10/2004 | Auyeng et al. |
| 6,815,015 B2 | * | 11/2004 | Young et al. ............... 506/40 |
| 6,835,426 B2 | | 12/2004 | Duignan et al. |
| 6,862,490 B1 | | 3/2005 | Duignan |
| 7,014,885 B1 | * | 3/2006 | Pique et al. ............... 427/294 |
| 7,103,087 B2 | | 9/2006 | Eastburn |
| 2002/0081397 A1 | | 6/2002 | McGill et al. |
| 2002/0197401 A1 | | 12/2002 | Auyeung et al. |
| 2003/0017277 A1 | | 1/2003 | Young et al. |
| 2006/0008590 A1 | | 1/2006 | King et al. |
| 2008/0139075 A1 | | 6/2008 | Birrell |

OTHER PUBLICATIONS

Written Opinion of The International Searching Authority for Application No. PCT/US2008/74508, Nov. 28, 2008.

International Search Report of the International Searching Authority for Application No. PCT/US2007/0068902, mailed on Aug. 28, 2008, 1 page.

Written Opinion of the International Searching Authority for Application No. PCT/US2007/0068902, mailed on Aug. 28, 2008, 5 pages.

Preliminary Report on Patentability for Application No. PCT/US2008/074508, mailed on Mar. 25, 2010, 6 pages.

Office Action for Chinese Patent Application No. 200880111559.4, mailed on Mar. 15, 2012, 8 pages.

Notice of Allowance for U.S. Appl. No. 11/748,281, mailed on Jun. 20, 2011, 9 pages.

Office Action for Chinese Patent Application No. 200780017335.2, mailed on Jan. 26, 2011, 11 pages.

Office Action for Chinese Patent Application No. 200880111559.4, mailed on Mar. 2, 2011, 16 pages.

Non-Final Office Action for U.S. Appl. No. 11/748,281, mailed on Dec. 20, 2010, 11 pages.

* cited by examiner

LASER DECAL TRANSFER OF ELECTRONIC MATERIALS

CROSS-REFERENCES TO RELATED APPLICATIONS

The present application claims benefit under 35 USC 119(e) of U.S. provisional application No. 60/972,704, filed Sep. 14, 2007, entitled "Laser Decal Transfer of Electronics Materials", the content of which is incorporated herein by reference in its entirety.

The present application is related to commonly assigned, U.S. application Ser. No. 11/748,281, now U.S. Pat. No. 8,025,542 entitled "Deposition Repair Apparatus And Methods" filed May 14, 2007, the content of which is incorporated herein by reference in its entirety.

BACKGROUND OF THE INVENTION

This invention relates generally to the non-contact direct printing of thin film features or patterns of electronic materials for the modification, customization and/or repair of display and microelectronic circuits, in particular, non-contact repair of micro-circuits such as required in the repair of flat panel displays.

For many applications, in particular the additive modification of electronic circuits fabricated using semiconductor processing technologies, as in the example of, vacuum deposition of the required materials or patterning using lithographic batch processes, there is a need for a process capable of generating a repair pattern to fix a defect on the existing circuit once it has been completed. For the additive modification to be compatible with the existing circuit, the material deposited must be of similar thickness, width and functionality as the already existing patterns. More specifically, the repair typically must satisfy "thin-film" characteristics; that is, have thickness of less than one micrometer, and more often less than 0.5 micrometer, and have line width of 5 micrometers or less. The only processes currently available for correcting manufactured circuits with additive thin film material in this range of dimensions require the presence of a vacuum. Examples of these vacuum processes include laser chemical vapor deposition (LCVD), focused ion beam (FIB) deposition and vacuum laser induced forward transfer. These techniques are used with limited success due to their complexity, limited choice of materials and slow deposition speed for the repair of patterned circuits on semiconductor wafers and lithography chrome masks. For large area circuits such as flat panel displays, only LCVD has been adapted for repair applications.

Atmospheric pressure and room temperature additive material methods or processes are typically limited to direct printing of electronic materials, for example, metal conductors, polymer, or ceramic dielectrics. Such processes require the use of functional rheological systems, as described in U.S. Pat. No. 6,805,918 (the '918 patent) and U.S. Pat. No. 7,014,885 (the '885 patent). More specifically, rheological systems are defined as the class of material with properties that lie in a range between solid and liquid, and are characterized by at least one fundamental rheological property such as elasticity or viscosity. Further, the rheological materials include but are not limited to gels, pastes, inks, concentrated solutions, suspensions, Newtonian and non-Newtonian fluids, viscoelastic solids and elastoviscous fluids. The rheological materials may include but not be limited to metal or non-metal including insulators as well as biological materials. The rheological materials are homogeneous mixtures and typically include (for example) functional materials, solvent or vehicle, chemical and rheology precursors, binders, surfactants, dispersant agents, powders, and/or biomaterials. The functional material is the material that contains the functional properties (such as electrical, magnetic, and so forth) of the desired deposit. The rheological materials may be metal or non-metal materials with particle sizes ranging from 5 to 500 nanometers and suspended within one or more solvents and/or binders, and having viscosity in the range of approximately 1 cP to 1,000, 000 cP.

Depending on the dispensing technique selected, the viscosity of the rheological system has to be chosen carefully. The viscosity can range from water-like inks with viscosities of 1 to 100 cP to thicker inks with medium to high viscosities (greater than 100 to approximately 100,000 cP) to thick pastes having viscosities greater than 100,000 cP. Inkjet inks have viscosities of approximately 5 to 20 cP at the jetting temperature. Screen printing inks may have viscosities of approximately 2000 cP, while screen printing pastes may have viscosities greater than about 50,000 cP.

Dispensing methods and techniques utilizing low viscosity inks include inkjet printhead droplet-on-demand dispensing technologies using piezoelectric, thermal, electrostatic, acoustic, or other drives. These methods have been well documented and use inks having viscosities less than 1000 cP, and usually less than 50 cP. Production-level inkjet applications typically dispense droplets in the tens of picoliter volume or more. Ten picoliters is equivalent to approximately a 26 micrometer diameter sphere. A thin film feature that is 5 micrometers in diameter by 0.3 micrometers thick has a volume of approximately 6 femtoliters, and the equivalent drop (sphere) is approximately 2 micrometers in diameter. Apparatus to create this droplet size is not yet available outside of research laboratories, and this small volume can be produced only with certain fluids not necessarily compatible with electronic materials or applications. Though developments continue, inkjet technologies for very fine line widths have not yet been proven for production.

Current shortcomings of inkjet droplet-on-demand methods to achieve lines less than 10 micrometers in width include: (i) apparatus compatibility limited to materials having viscosities less than about 1000 cP and more typically less than 50 cP, which further implies (ii) low metals content and thus (iii) further requires multiple passes to achieve conductivity requirements, impacting throughput; (iv) apparatus capability limited to producing a mean of droplet distribution of greater than or equal to approximately 5 micrometer diameter, which limits minimum line width to approximately 7 micrometer; and (v) multiple factors determining line width size and edge integrity include mean of droplet distribution, ink viscosity, ink/substrate contact angle, substrate surface energy, substrate surface morphology, printing and drying temperature.

Laser transfer or laser direct printing methods of functional rheological systems are described, for example, in US patents '918 and '885, and U.S. Pat. No. 8,025,542 (the '542 application). FIG. 1 shows a conventional apparatus 100 required for laser transfer of rheological materials. The coating to be transferred 108 is applied to a transparent substrate, or ribbon, 106 facing the receiving substrate 104. The ribbon serves as a supporting structure for the coating, and must be optically transparent to the laser wavelengths in use. A pulsed laser beam 116 is directed through focusing optics such as an objective lens, or final lens, 102 at the ribbon surface opposite the coating, and the coating is transferred to the receiving substrate 104. A transferred pattern 110 is formed on the receiving substrate by moving the receiving substrate 104 with respect to the laser 116, and moving the ribbon relative to the laser such that a coated region is always available for transfer. The transferred pattern on the receiving substrate may require curing (not shown). Typically, the ribbon extent is larger than the laser beam that impacts it. As shown in FIG. 1A, the coating on the transparent ribbon is held at a fixed distance from the receiving substrate, and the pulsed laser propels the released coating layer across the gap.

Key parameters for laser direct printing include (a) the nature of the material to be transferred, (b) the laser energy density, and (c) the transfer mechanics which depends on both the nature of material and available energy. For example, the MAPLE-DW process as described in U.S. Pat. No. 6,177,151 (the '151 patent) and U.S. Pat. No. 6,766,764 (the '764 patent) combines a transfer material with a matrix material, which specifically has the property of being more volatile than the transfer material when exposed to pulsed laser energy. The transfer materials may include but not be limited to metals or non-metals including insulators as well as biological materials. The coated material (matrix plus transfer materials) is assumed to be in solid state during the deposition process. Transfer energy densities for metals using the MAPLE-DW process cited in '151 and '764 are typically 300 to 500 $mJ/cm^2$. The MAPLE-DW transfer mechanism consists of volatizing or vaporizing the matrix material, which then causes desorption of the transfer material from the supporting ribbon to the receiving substrate. The MAPLE-DW process assumes that after transfer, the deposited material needs no additional processing.

In the '918 patent examples, transfer energy densities for metals using the rheological material transfer process were cited as 400 to 500 $mJ/cm^2$. The rheological material transfer mechanism as described by the '918 and '885 patents consists of the following steps, and as shown schematically in FIGS. 2A and 2B: (a) the laser energy 116 locally heats a very small volume of the rheological fluid 202 near the supporting ribbon surface, and then (b) the vaporized material generates a high pressure burst that propels the non-vaporized fluid 110 forward to the receiving substrate 104. The material that is transferred is substantially unchanged rheological fluid. Most deposition materials require post-processing steps such as thermal, photothermal, or photolytic processes to decompose any chemical precursors, or drive off solvent vehicles, or consolidate or densify or sinter the functional materials and permanent binders.

Further, the jetting effect described in U.S. Pat. No. 6,815,015 (the '015 patent) occurs under narrow process window conditions using rheological fluids. Specifically, the transfer energy density is tailored to control the transfer process so that the material transferred remains roughly the same size or smaller than the incident laser beam profile. Transfer energy density for the jetting process reported in the '015 patent is less than 100 $mJ/cm^2$. Operation in the jetting window is advantageous in that feature sizes comparable to the incident laser beam size may be created. However, the conditions for jetting behavior as described in the '015 patent requires relatively thick coatings (1 to 20 micrometers thick, and more specifically 5 to 10 micrometers in the cited example) on the transparent ribbon. This relatively large volume of rheological fluid is required to form the neck or jet shown in FIG. 6D of the '015 patent, and shown schematically as 204 in FIGS. 2C and 2D of the present application. The result is equally thick transferred features, far larger than the submicron thickness required for thin film repair. In addition, to form the neck or jet 204, the rheological fluid must exhibit fluid properties with viscosities well below 100,000 cP, and more likely, less than 10,000 cP. Then, due to the droplet-like properties of the transfer generated under the jetting regime, the resulting transfers will exhibit a large amount of debris or splashing 112 outside the intended transfer feature 110 when the jetting droplets strike the surface of the receiving substrate. Thus, a further limitation of operation in the jetting regime of a laser transfer approach is that it cannot produce well defined narrow features or patterns with consistent and repeatable straight edges, as required for thin film repair of microcircuits.

Key parameters required to print features with thin film characteristics, that is, five micrometer line width by submicrometer thickness with well defined and straight edges and uniform thickness using rheological materials include, for example, (i) material size, uniformity and thickness on the ribbon substrate (material transfer methods) or delivered droplet size (aerosol jet or ink jet), (ii) material flow at the receiving substrate surface, which can be a function of delivery or substrate temperature, viscosity, substrate material, surface morphology or roughness and surface energy conditions, (iii) relative position of the delivery mechanism to the receiving substrate. In the case of an ink jet system or a laser forward transfer system operating in the jetting regime, for example, too large a distance may result in excessive line width (due to spreading of droplets) while too close a distance may also result in excessive line width due to poor line edge definition (caused by splatter of the droplets). Additional parameters that must be considered in direct printing of thin five micrometer wide lines with good line edge definition using rheological materials include: (iv) material particle size in the ink or rheological material, for metals, typical metal particles sizes should be in tens of nanometers or less, (v) aperture size in delivery mechanisms, and (vi) beam size, (vii) energy density and uniformity, and (viii) wavelength of the laser or energy source.

Conventional direct printing techniques fall short of the requirements to produce narrow features with thin film characteristics as those required for the modification, customization and/or repair of display and microelectronic circuits, in particular, non-contact additive material repair of micro-circuits such as required in the repair of flat panel displays. The jetting regime described in the '015 patent does not meet the thin film requirements and is not suitable for use in forming thin film line features that are nominally five or less micrometers wide and have sub-micrometer thicknesses.

BRIEF SUMMARY OF THE INVENTION

A laser transfer process, in accordance with the present invention and referred to herein as laser decal transfer, is used to generate thin film-like features by operating in a laminar transfer regime as opposed to other conventional laser transfer techniques which operate in either ablative, matrix vaporizing or jetting regimes. An apparatus that performs a laser decal transfer is adapted to receive a receiving substrate, a target substrate and includes a laser source. The target substrate includes, in part, a laser transparent support having a back surface and a front surface. The front surface of the target substrate is spaced away from the receiving substrate at a given gap distance and is coated with a thin layer of a high viscosity rheological fluid. Laser pulses of very low energy are directed through the back of the target substrate illuminating the thin coating over an area determined by a variable aperture centered about the laser beam. The laser decal transfer process allows for the release and transfer from the target substrate of a uniform and continuous layer substantially identical to the laser irradiated area. The released layer is transferred across the gap with substantially no changes to its initial size and shape, thus producing thin film features with widths down to several micrometers and thickness of a few tenths of a micron on the surface of the receiving substrate. The combination of a highly uniform with low energy density laser source interacting with a very thin coating of a high viscosity rheological fluid allows the smooth release of the area exposed to the laser pulse, while simultaneously dampening any shear forces generated by the release and transfer of the layer. That is, the motion of the layer behaves as the motion of a fluid in the laminar flow regime. The laser decal transfer process is different from other known laser transfer processes in that it results in the transfer of patterns that are substantially 1-to-1 in size and shape to the area on the target substrate illuminated by the laser. The resulting patterns transferred onto the surface of the receiving substrate are highly uniform in thickness and morphology, have sharp edge features and exhibit high adhesion, independent of the surface energy, wetting or phobicity of the receiving substrate. In laser decal transfer there is no formation of droplets or debris outside the deposition region, which are symptomatic of other non-contact transfer or jetting techniques, thus allowing the generation of patterns with features and resolutions similar to those achievable by lithographic or contact transfer techniques.

In one embodiment, the viscosity of the rheological compound is equal to or greater than 10,000 centiPoises (cP). In another embodiment, the coating has a thickness equal to or less than 2 micrometers.

In one embodiment, the laser decal transfer method of the present invention is optionally performed at room temperature and atmospheric pressure. The laser may be a pulsed laser or a continuous wave laser, and the laser energy may be focused through a lens. In one embodiment, the laser beam repeatedly illuminates successive defined target locations to cause depositions at successive defined receiving locations. The deposits may form a two-dimensional pattern or a three-dimensional pattern.

In one embodiment, the target substrate includes a laser-transparent flexible ribbon that is transparent to a wavelength of the laser beam. In one embodiment, the laser beam has a plurality of wavelengths concurrently present therein. In one embodiment, the pulse length of the laser beam is varied.

In one embodiment, the distance between the target substrate and the receiving substrate is maintained within a pre-defined range as the target substrate is moved relative to the receiving substrate. In one embodiment, a variable shape aperture is maintained centered about the laser beam as the target substrate is moved relative to the laser beam.

In one embodiment, the rheological compound deposited on the receiving substrate is cured using the laser beam. In another embodiment, a different heating element may be used to cure the rheological compound deposited on the receiving substrate. Such a heating element may be a laser beam different from the laser beam used during the decal transfers.

The receiving substrate may be flat panel display, a solar panel, or a semiconductor wafer substrate, etc. Furthermore, the substrate may be planar or nor-planar. In one embodiment, the deposited rheological compound provides an electrical connection between a pair of nodes. In one embodiment, the ribbon includes a recessed well coated with the rheological compound. The recessed well is adapted to be positioned in the optical path of the laser beam.

DESCRIPTION OF THE INVENTION

In accordance with one embodiment of the present invention, a rheological compound with a defined shape is transferred from a target substrate to a receiving substrate using an incident laser beam. The compound is illuminated with a laser beam whose energy density is so selected as to cause a decal transfer of the laser-illuminated non-evaporated rheological compound to occur. Accordingly, the laser-illuminated non-evaporated rheological compound is released from and propelled away from the target substrate and is deposited at a defined location on the receiving substrate.

The decal transfer, also called template transfer, in accordance with the present invention, achieves the desired small line widths and sub-micrometer thicknesses. More specifically, the decal transfer is a transfer of rheological material that has substantially one-to-one correspondence in shape and area to the laser transferring pulse striking the target substrate, i.e., ribbon, on which the material to be transferred has been applied, with resulting transferred features exhibiting uniform and well defined edges as well as thickness across the entire area of interest. Accordingly, the area of the ribbon interface exposed to the laser pulse releases an identical area of high viscosity rheological material which retains its shape while it travels across the gap between the ribbon and the receiving substrate and forms a deposited pattern of the same dimensions. The decal laser transfer process occurs at ambient conditions; that is, at approximately room temperature and at approximately atmospheric conditions.

Figure 3A:
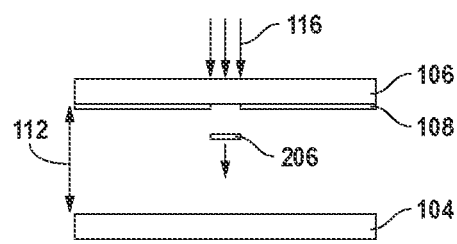
FIG. 3A shows a rheological compound that has been released from a target substrate in response to an incident laser beam and being propelled toward a receiving substrate using a decal transfer, in accordance with one embodiment of the present invention.
Figure 3B:
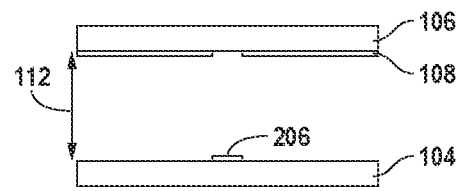
FIG. 3B shows the released rheological compound of FIG. 3A after it has been transferred to the receiving substrate, in accordance with one embodiment of the present invention.

FIGS. 3A and 3B shows the decal transfer of material 206 which is propelled toward the receiving substrate 104 and which remains intact when it lands. In accordance with the present invention, a coating of rheological material of specific repeatable composition and form is transferred to a substrate at a repeatable position relative to the laser beam and receiving substrate. An apparatus that performs operations in the laser decal transfer regime is described in U.S. Pat. No. 8,025,542.

A strong dependency exists between the decal transfer and the properties of the rheological materials, and in particular, the requirement for a high viscosity material, with viscosity greater than 10,000 cP, and more specifically greater than 100,000 cP. In particular, the use of high viscosity pastes for laser decal transfer allows for the release of a uniform, non-fragmented, non-deformed sheared layer that is included in the coating of the ribbon. The large cohesive forces present in a higher viscosity paste make this possible. As shown in FIGS. 3A and 3B, the transferred high viscosity layer 206 remains intact as it is propelled across the gap 112 separating the ribbon 106 from the receiving substrate 104. Further, because the transferred high viscosity layer 206 remains substantially intact, it may be propelled across relatively large gaps 112, more specifically, gap distances on the order of ten or more micrometers. In comparison, when a lower viscosity ink travels across a gap of less than a few microns, it breaks up into smaller elements due to both surface tension of the ink and resistance with the ambient air present in the gap. Another consequence of the fragmentation of a lower viscosity fluid into smaller elements is that the higher surface energies present due to the reduced viscosity cause the fragments to form smaller spheres thus resulting in the transfer of small droplets which will not form a continuous uniform layer upon hitting the surface of the receiving substrate. The small droplets (spheres) instead tend to spread over an area larger than the original laser transfer spot; thus resulting in the inevitable presence of debris.

Figure 1:
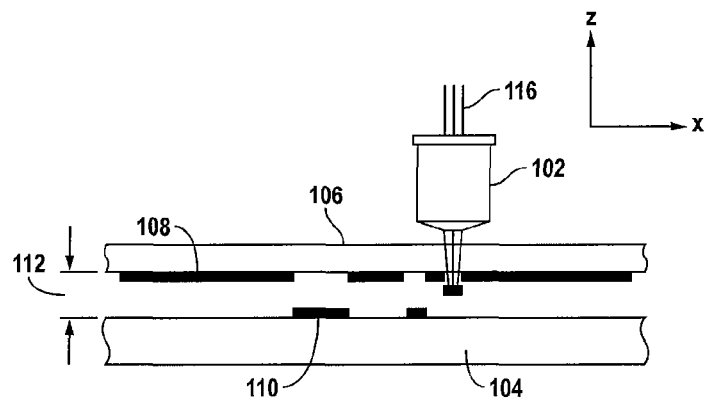
FIG. 1 shows a laser transfer apparatus.
Figure 2A:
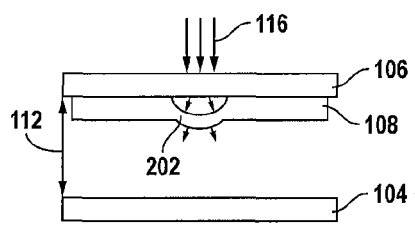
FIG. 2A shows a laser transfer of a material in accordance with a MAPLE-DW process, as known in the prior art.
Figure 2B:
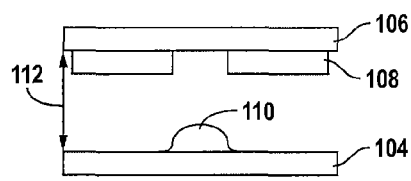
FIG. 2B shows the material of FIG. 2A after it is transferred to the receiving substrate.
Figure 2C:
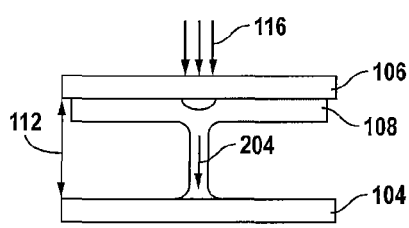
FIG. 2C shows a transfer of a material in accordance with a jetting process, as known in the prior art.
Figure 2D:
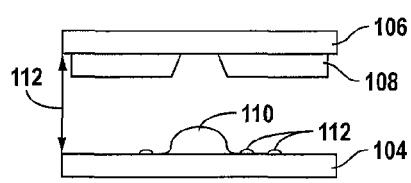
FIG. 2D shows the material of FIG. 2C after it is transferred to its receiving substrate.

In general, high viscosity rheological materials such as pastes offer a number of advantages over low viscosity rheological materials such as inks. First, high viscosity pastes have significantly higher solids content, and thus, in printing metal features where conductivity is important, high viscosity pastes may be applied in a single pass while several passes of low viscosity inks may be required to achieve the target conductivity. Further, high viscosity materials are less affected by the receiving substrate surface energy properties, and in particular, are less likely to spread after reaching the surface of the receiving substrate due to contact angle effects. This is a very important consideration since high viscosity pastes are less likely to be affected by a receiving substrate's surface phobicity, and are more likely to have good adhesion to the surface of the receiving substrate. Also, since high viscosity pastes retain their shape upon reaching the receiving substrate, continuous patterns with well defined and uniform edges may be formed across surface imperfections such as roughness, slopes, and steps. FIGS. 2B and 2D illustrate the resulting shape of low viscosity materials transferred using MAPLE-DW and jetting processes of prior art. FIGS. 3A and 3B illustrates the result of decal transfer of high viscosity material of the present invention. The advantages of the decal transfer of the present invention are seen from a comparison of FIGS. 2B, 2D and 3A and 3B.

Coating thickness is a critical variable in the decal transfer process and a significant factor in distinguishing the decal transfer from other laser transfer techniques, such as the jetting regime. Experiments indicate best decal transfers occur when coatings are less than one micrometer in thickness, and more specifically, less than 0.5 micrometers in thickness. In contrast, the jetting regime as described in U.S. Pat. No. 6,815,015 requires coating thicknesses that are on the order of 10 micrometers. A thicker coating requires higher laser energy to dislodge the coating from its surroundings. This higher energy laser pulse may result in hotter or more vapor generated from heating solvents within the coating, and thus cause a higher pressure pulse that will not only dislodge the coating material from the ribbon, but also disrupt the integrity of the transferred coating material by causing it to break into pieces. In contrast, since the decal transfer process transfers the coating material identically, very thin coatings must also be very uniform, and in particular, have no pinholes or gaps.

Coating thickness coupled with coating viscosity are important factors in decal transfers. Decal transfer occurs best at high viscosities and low thicknesses, while jetting transfers require far lower viscosities and larger thicknesses (larger volumes) to enable formation of the neck or jet.

Constancy of the compositional balance of the rheological material is required for repeatable and reproducible decal transfers. The materials to be transferred in the LIFT and MAPLE-DW processes are usually solids, whereas the rheological materials are homogeneous mixtures including functional material, solvent or carrier materials, binders, dispersants, etc., any of which contribute to the rheological properties such as viscosity. Some selected rheological materials may include solvents or fluids with low, but non-zero, vapor pressures, thereby causing changes in the rheological material over time due to evaporation of such solvents or fluids. The very thin coating on the ribbon needed for the decal transfer method may be highly unstable because of the very high surface area-to-volume ratio, which enhances the evaporation of any volatile components in the ink. Thus, for consistent decal transfers, particularly at line widths less than or equal to 5 micrometers, the rheological material to be transferred must have consistent properties over time. Preservation of the composition may be achieved by several means, including (a) placing the rheological material to be transferred within an environment that inhibits change (for example, one that controls temperature, humidity, and pressure conditions), or (b) controlling the sequencing of process and handling steps such that the rheological material's exposure time at transfer is nearly always the same, as described in U.S. Pat. No. 8,025,542.

Figure 4A:
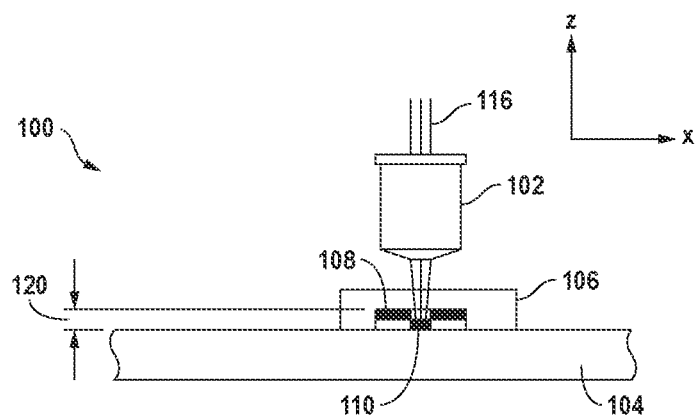
FIG. 4A shows a cross sectional view of an apparatus adapted for laser decal transfer of a material from a target substrate to a receiving substrate.
Figure 4B:
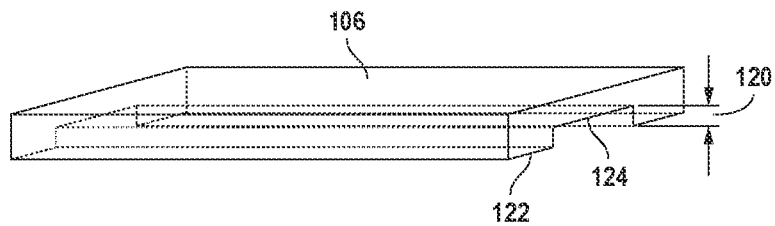
FIG. 4B shows a ribbon having recessed well adapted to hold a rheological compound to be transferred using a laser decal transfer, in accordance with one embodiment of the present invention.

As described in U.S. Pat. No. 8,025,542, one embodiment adapted to maintain a constant ribbon height position relative to the receiving substrate includes a recess or well formed in the ribbon which is then filled with the rheological material, as illustrated in FIGS. 4A and 4B. FIG. 4B is a perspective view of ribbon 106 having recessed well 124 formed therein. Recessed well 124 provides a means to achieve repeatable uniform thickness of the rheological material disposed in the well. The non-recessed surface 122 can contact the receiving substrate 104 without contaminating the receiving substrate with untransferred coating material. Alternatively, the ribbon with recessed well may be held at a fixed gap above the receiving substrate.

For laser decal transfer, a well depth 120 of a few tenths of a micrometer to about two micrometer is used to provide a suitable line integrity at nominal five micrometer line widths and submicron line thicknesses. Uniform application of the coating into these wells can be achieved using well-known doctor blade techniques. The use of recessed wells in the ribbon enables the use of rigid or flexible substrate materials. Once the paste has been doctor bladed into the ribbon wells, the rheology of the paste is maintained for long enough times to permit set up and implementation of numerous transfers before the paste dries.

The laser for decal transfer may be a diode pumped laser, a flash-lamp pumped laser, a continuous wave laser, or any other laser suitable for material transfer. The selected laser may have broader capability requirements for those cases in which the function of material transfer is combined with material removal. Commercially available pulsed lasers typically span the full spectral range from deep ultraviolet (UV) to infrared (IR), and more specifically from 266 nm to 1064 nm, and with pulse widths ranging from $10^{-12}$ to $10^{-6}$ seconds, and pulse repetition frequencies from 0 to more than 100 KHz. An example of a suitable laser is a frequency quadrupled or tripled Q-switched Nd:YAG (or Nd:YVO$_4$) laser, having a wide range of wavelengths such as 1064 nm (IR), 532 nm (green), 355 nm (UV), 266 nm (deep UV), and providing pulses less than 100 nanoseconds, and typically, between five and thirty nanoseconds. The beam profile of the laser should have a "top-hat" profile, with uniformity across the area to be decal-transferred. Transfers may also result with less uniform beam profiles, such as Gaussian profiles. Laser fluence for laser transfer of rheological materials in the decal transfer regime is typically in the range of 15 to 50 mJ/cm$^2$. The laser, such as a Q-switched laser, may be configured to provide pulses less than 100 nanoseconds for transfer and for cutting repair, and also pulses that are several hundred microseconds long (for example, 100 to 300 microseconds) or in continuous-wave (cw) mode for curing of the transferred line.

To enable a decal transfer, certain conditions must be met. The materials to be transferred must have high viscosity (greater than 10,000 cP, and typically greater than 100,000 cP), the coating thickness must be typically less than one micrometer, and the laser beam energies (and fluence) must be relatively low (less than approximately 50 mJ/cm$^2$.) The combination of a highly uniform and low energy density laser source interacting with a very thin coating of a high viscosity rheological fluid allows the smooth release of the area exposed to the laser pulse, while simultaneously dampening any shear forces generated by the release and transfer of the layer. That is, the motion of the layer behaves as the motion of a fluid in the laminar flow regime. Decal transfer operates in the laminar transfer regime, as opposed to other laser transfer techniques which operate in either ablative, matrix vaporizing or jetting regimes. With these conditions, the laser decal transfer method results in the transfer or deposition of high viscosity coating material that is 1-to-1 in size and shape of the laser spot illuminating the ribbon on which the coating material is applied. That is, the area of the ribbon interface exposed to the laser pulse releases a substantially identical area of high viscosity rheological material which retains its shape while it travels across the gap between the ribbon and the receiving substrate and forms a deposited pattern of substantially the same dimensions. Further, because the transferred high viscosity layer remains substantially intact, it may be propelled across relatively large gaps, more specifically, gap distances on the order of ten or more micrometers.

Figure 5A:
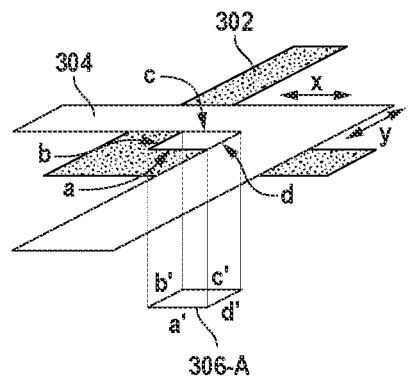
FIGS. 5A, 5B and 5C are exemplary arrangements for beam shaping, in accordance with the decal transfer of the present invention.
Figure 5B:
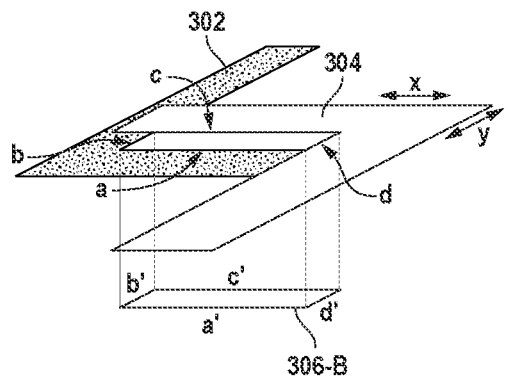
Figure 5C:
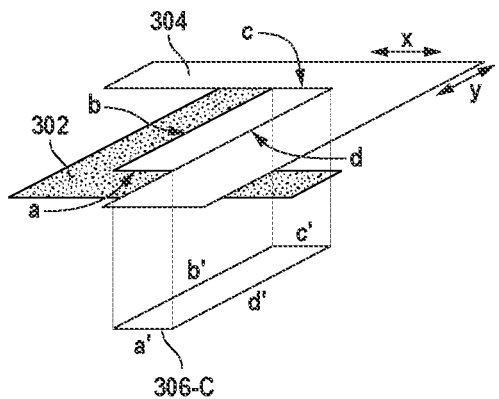

Unlike other laser forward transfer methods, the resulting feature size and shape using the conditions for decal transfer is directly governed by the laser beam shape and the uniformity profile of the beam once the coating layer on the ribbon is optimized. The implications of this decal transfer behavior are several-fold, and provide substantial advantages over other laser forward transfer techniques. By optically shaping the laser beam and forming, for example, squares or rectangles, the laser decal transfer process results in the direct printing of corresponding square or rectangle shaped materials. As described in U.S. Pat. No. 8,025,542, the laser printing apparatus may include a shaped aperture or variable shaped aperture in the beam path. A variable shaped aperture permits varying sizes of rectangles, such as squares (FIG. 5A) or rectangles (FIG. 5B or 5C) having one dimension the same size as the smallest spot size. In the examples illustrated in FIGS. 5A, 5B, and 5C, two sides (a and b) of the aperture are held fixed while the remaining two edges (c and d) are moved in x and/or y. Different sized beam shapes a'b'c'd' may be formed, and these can be reproduced identically in shape and size by the decal transfer process. Other methods of creating different sized apertures are possible. For example, in one embodiment, a variable aperture may include four (a, b, c, d) movable edges.

For example, rather than printing a line of ten adjacent squares that are each five micrometers by five micrometers using ten laser pulses, the same five by fifty micrometer line may be printed using a shaped beam that is a five by fifty micrometer rectangle and a single laser pulse. In another example, if the required feature is an "L" shaped line, e.g., fifty micrometers leg length and five micrometers in line width, the decal transfer process may print the "L" in as few as two steps: first varying the aperture to produce a beam that is 5 micrometers by 50 micrometers in size (illustrated, for example, in FIG. 5B), and then changing the aperture to form a 50 micrometers by 5 micrometer sized beam (illustrated, for example in FIG. 5C). In yet another example, a large area, e.g., 50 micrometers by 50 micrometers, may be printed in one pulse if a corresponding aperture size, and thus beam size, is set up. Therefore, a first advantage of the laser decal transfer method is that the transferred features may have a shape defined by the user through beam shaping aperture arrangements.

A second advantage of the laser decal transfer method with a variable shape aperture is throughput, since these in combination allow configuration of a desired pattern with the largest possible features in the fewest steps, and therefore completion of writing within times that are far shorter than those achieved by any other conventional direct write method. A third advantage of the laser decal transfer method is that feature size is governed by the laser optics. This means that unlike in inkjet droplet-on-demand or even the laser forward transfer methods using lower viscosity materials, for correspondingly very narrow (less than five micrometers) illuminating beam profiles and assuming sufficient beam energy to transfer material, corresponding very narrow lines may be printed.

A fourth advantage of decal transfer, in accordance with the present invention, is that it can produce the desired pattern with minimal to no amount of surrounding extraneous debris. Decal transfer operates in the laminar transfer regime, as opposed to other laser transfer techniques and inkjet processes which operate in either ablative, matrix vaporizing or jetting regimes, which give rise to splatter and other debris occur because of the impact of the transferred material or ink moving at high velocity with the substrate surface. Debris may give rise to unwanted cross contamination or unwanted creation of electrical shorts in the neighborhood of the circuit or pattern being repaired or modified.

A fifth advantage of decal transfer is that it enables the formation of a self-standing structure across a gap or void on the receiving substrate. This allows the deposition of free standing layers or bridges which have potential application in the direct printing of crossovers and other three dimensional structures.

A sixth advantage of the decal process is its capability to transfer features of very low thickness. The resulting transfers by the jetting process described in U.S. Pat. No. 6,815,015 and by the early MAPLE-DW efforts described in U.S. Pat. Nos. 6,805,918 and 6,177,151 were typically on the order of ten micrometers in thickness. The decal process of the present invention is capable of transferring layers on the order of 0.1 micrometers thick.

The laser decal transfer method may require curing of the transferred rheological material. For example, for formation of thin film metal lines, rheological pastes with metal nanoparticles mixed into carriers including solvents and binders may be used, and will require heating after transfer to drive off the non-metal solvents and binders. Cure hardware may consist of a laser (continuous wave or pulsed) or a laser diode and any associated optics required to provide a thermal source to cure the transferred material deposited during direct write transfers. Alternatively, the transfer laser assembly may be configured to provide the necessary curing parameters (pulse length, energy), or a dedicated curing laser may be assigned in addition to a dedicated transfer laser.

In the case in which a laser is utilized for curing, the laser wavelength should be appropriately matched to the rheological material requiring curing (or heating). Traditionally, laser curing processes have used infrared (IR) lasers, because of the association of IR wavelengths with heating. One embodiment of the present invention uses the green (or 532 nm for a Nd:YAG laser) wavelength for curing metal (in particular, gold and silver) nanoparticle pastes and inks because their electron plasmon resonance takes place at frequencies corresponding to photon energies in the neighborhood of 2.48 eV, and the 532 nm wavelength photons can couple their energy very efficiently to the silver nanoparticles resulting in heating and curing. The use of a green wavelength rather than an IR wavelength to cure the thin film transferred pattern has further advantage in that for repair applications, it is often required that heating effects of the substrate under the transferred pattern and surrounding areas be minimized to avoid damage. For example, in repair of flat panel display circuits, glass and ITO layers are transparent at green wavelengths and absorb more at IR wavelengths.

In one example, ink paste with silver nanometer sized particles and having viscosity of greater than approximately 120,000 cP was applied to a glass ribbon substrate using standard doctor blading techniques. The ink paste coating was approximately 0.3 micrometers thick. The glass ribbon substrate was then inverted so that the paste coating faced a receiving substrate of plain glass. A gap of approximately 8 micrometers was established between the paste coating and the receiving substrate. A pulsed frequency-tripled Nd:YVO$_4$ laser beam (355 nm wavelength) was directed through a rectangular aperture and imaged through a 20× microscope objective so that a five by fifteen micrometer rectangular beam was incident on the glass ribbon substrate. The receiving substrate was held by a vacuum chuck that is mounted on an x-y stage. Transfers of five by fifteen micrometer rectangular patterns approximately 0.3 micrometers thick were produced onto the receiving substrate by coordinating the laser pulsing with the stepping of the x-y stage. The line was printed between gold pads on the receiving substrate that were separated by 180 microns. The stage speed was approximately 50 micrometers/sec and the spacing between laser shots was typically 12 micrometers to allow for adequate overlap between the transferred patterns. The beam focal fluence was approximately 33 mJ/cm$^2$. The printed line was cured using a continuous-wave green laser operating at 532 nm wavelength and directed through the same microscope objective. The green laser was set to a focal intensity of approximately 27 kW/cm$^2$ and scanned over the printed line. The resulting line had good adhesion (4× tape test) and had an electrical resistivity of approximately 10 micro-ohm-cm.

In another example, an uncured sample was prepared as described above in Example 1. However, in this example, the printed line on the glass sample was oven-cured at a temperature of 350 C. The resulting line displayed good adhesion (4× tape test).

In yet another example, silver ink paste was applied to a glass ribbon substrate as in Example 1. The receiving substrate was a portion of a flat panel display circuitry including a step feature that was approximately 50 micrometers by 50 micrometers and 3 micrometers deep. A line of transferred rectangles 5 by 15 micrometers in size was printed (at a speed of 50 micrometers/sec) while traversing across the step feature. The resulting printed line conformed to the step feature, first crossing from the top surface to the sloped sidewall, then across the bottom of the stepped feature and then back along the opposite sidewall and continuing to the top surface. The printed line was laser-cured at 532 nm wavelength at a focal intensity of approximately 10 kW/cm$^2$ and a speed of 50 micrometers per second. Scanning electron microscopy showed that the line was continuous and highly densified. Laser curing of lines across similar types of surfaces resulted in an electrical resistivity of approximately 48 micro-ohm-centimeter. Oven-curing was also used and resulted in similarly good step coverage by the printed line.

The above embodiments of the present invention are illustrative and not limiting. Various alternatives and equivalents are possible. Although, the invention has been described with reference to a flat panel array repair by way of an example, it is understood that the invention may be applied to other repair processes within FPD fabrication, such as color filter repair, or panel repair. Further, the invention may be used in direct writing applications requiring deposition, such as microelectronic circuit creation and repair, printing of circuits on flat panels and solar panels, or repair of solar panels, or creation of capacitors, batteries, semiconductor circuits, etc. Other additions, subtractions or modifications are obvious in view of the present disclosure and are intended to fall within the scope of the appended claims.

What is claimed is:

1. A method for laser decal transfer comprising:
providing a receiving substrate;
providing a target substrate spaced away from the receiving substrate and comprising a laser transparent support having a back surface and a front surface, wherein the front surface of the target substrate is coated with a layer of a rheological compound of selected thickness and viscosity; and
providing an incident laser beam directed through the back of the target substrate to illuminate a given area of the coating, said illuminated area having a size and a shape, said incident laser beam having an energy density and uniformity selected so as to uniformly release and laminarly transfer a region of the coating from the target substrate towards the receiving substrate, wherein the rheological compound is not substantially evaporated while transferred, wherein the transferred rheological compound forms a deposit at a defined location on the surface of the receiving substrate; said transferred rheological compound having a substantially 1-to-1 correspondence in size and shape with the size and shape of the incident laser illuminated area, thereby causing a decal transfer of the rheological compound.

2. The method of claim 1 wherein a viscosity of the rheological compound is equal to or greater than 10,000 centiPoises (cP).

3. The method of claim 1 wherein said coating has a thickness equal to or less than 2 micrometers.

4. The method of claim 1 wherein said method is carried out at about room temperature and at about atmospheric pressure.

5. The method of claim 1 wherein the incident laser beam is selected from a group consisting of a pulsed laser and a continuous wave laser.

6. The method of claim 1 wherein the incident laser beam is focused through a microscope objective lens or other focusing optics to form the incident laser beam.

7. The method of claim 1 wherein the incident laser beam is shaped by an aperture.

8. The method of claim 7 further comprising:
maintaining at least one fixed shaped aperture centered about the incident laser beam as the target substrate is moved relative to the incident laser beam.

9. The method of claim 7 further comprising:
maintaining a variable shaped aperture centered about the incident laser beam as the target substrate is moved relative to the incident laser beam.

10. The method of claim 9 further comprising:
varying a size of the variable shaped aperture about a center of the incident laser beam as the target substrate is moved relative to the incident laser beam.

11. The method of claim 1 wherein the step of providing the incident laser beam is repeated at successive defined target locations and successive defined receiving locations, and wherein the deposit forms one of a two-dimensional pattern or a three-dimensional pattern.

12. The method of claim 1 wherein the laser-transparent support is selected from a group consisting of glass and polymer plastic.

13. The method of claim 1 wherein the receiving substrate comprises a non-planar surface.

14. The method of claim 1 wherein the rheological compound is selected from a group consisting of paste, gel, ink, concentrated solutions, suspensions, Newtonian fluids, non-Newtonian fluids, viscoelastic fluids, and elasticoviscous fluids.

15. The method of claim 1 further comprising:
maintaining a distance between the target substrate and the receiving substrate within a predefined range as the target substrate is moved relative to the receiving substrate.

16. The method of claim 1 wherein said incident laser beam has a plurality of wavelengths concurrently present therein.

17. The method of claim 1 further comprising:
varying a pulse length of the incident laser beam.

18. The method of claim 1 further comprising:
curing the rheological compound deposited on the receiving substrate using the incident laser beam.

19. The method of claim 1 further comprising:
heating the rheological compound deposited on the receiving substrate.

20. The method of claim 19 further comprising:
curing the rheological compound deposited on the substrate using a second laser beam.

21. The method of claim 1 wherein said receiving substrate comprises micro-circuitry and is selected from a group consisting of flat panel display, solar panel, and semiconductor wafer substrates.

22. The method of claim 1 wherein said deposited rheological compound provides an electrical connection between a pair of nodes.

23. The method of claim 12 wherein said target substrate comprises a first recessed well coated with the rheological compound, said first recessed well adapted to be positioned in the optical path of the incident laser beam.

24. The method of claim 1 wherein said deposited rheological compound provides a self-standing connecting structure across a gap or void on the receiving substrate.

25. The method of claim 1 wherein said deposited rheological compound has a thickness equal to or less than 1 micrometer.

26. The method of claim 1 wherein the beam profile of said incident laser beam is a top-hat profile.

27. A method for laser decal transfer comprising:
providing a receiving substrate;
providing a target substrate spaced away from the receiving substrate and comprising a laser transparent support having a back surface and a front surface, wherein the front surface of the target substrate is coated with a layer of a rheological compound of selected thickness and viscosity; and
providing an incident laser beam directed through the back of the target substrate to illuminate a given area of the coating, said incident laser beam having an energy density selected so as to uniformly release and laminarly transfer a region of the coating from the target substrate towards the receiving substrate, wherein the rheological compound is not substantially evaporated while transferred, wherein the transferred rheological compound forms a deposit at a defined location on the surface of the receiving substrate, said deposit being substantially similar in size and shape to size and shape of the area illuminated by the incident laser beam.

28. The method of claim 27 wherein the beam profile of said incident laser beam is a top-hat profile.

* * * * *